(12) United States Patent
Yoshida et al.

(10) Patent No.: US 9,302,327 B2
(45) Date of Patent: Apr. 5, 2016

(54) DIAMOND COATED TOOL

(75) Inventors: Katsuhito Yoshida, Itami (JP); Shigeru Yoshida, Itami (JP); Yuichiro Seki, Itami (JP); Kiichi Meguro, Itami (JP); Shinji Matsukawa, Itami (JP)

(73) Assignees: Sumitomo Electric Industries, Ltd., Osaka-shi (JP); SUMITOMO ELECTRIC HARDMETAL CORP., Itami-shi (JP)

( * ) Notice: Subject to any disclaimer, the term of this patent is extended or adjusted under 35 U.S.C. 154(b) by 134 days.

(21) Appl. No.: 13/139,799

(22) PCT Filed: Jun. 8, 2010

(86) PCT No.: PCT/JP2010/059694
§ 371 (c)(1),
(2), (4) Date: Jun. 15, 2011

(87) PCT Pub. No.: WO2011/018917
PCT Pub. Date: Feb. 17, 2011

(65) Prior Publication Data
US 2011/0250394 A1    Oct. 13, 2011

(30) Foreign Application Priority Data

Aug. 11, 2009  (JP) .................................. 2009-186563

(51) Int. Cl.
*B24D 3/00*  (2006.01)
*B23B 27/20*  (2006.01)
(Continued)

(52) U.S. Cl.
CPC ........... *B23B 27/146* (2013.01); *C23C 16/0227* (2013.01); *C23C 16/27* (2013.01); *C23C 16/271* (2013.01); *B23B 2226/315* (2013.01); *Y10T 428/24372* (2015.01)

(58) Field of Classification Search
CPC .............. B23B 27/146; B23B 2226/31; B23B 2226/315; C23C 16/27
USPC .................................................. 428/141, 143
See application file for complete search history.

(56) References Cited

U.S. PATENT DOCUMENTS 4,731,296 A    3/1988  Kikuchi et al.
5,558,789 A *  9/1996  Singh ....................... 219/121.69
(Continued)

FOREIGN PATENT DOCUMENTS

JP    61-052363    3/1986
JP    63-053269    3/1988
(Continued)

OTHER PUBLICATIONS

JPO Website Machine English Translation of JP 05-311442, Shingo et al., Nov. 22, 1993.*
European Search Report in European Patent Application No. 10808102.7-1353, dated Oct. 2, 2013.

*Primary Examiner* — M. Veronica Ewald
*Assistant Examiner* — Laura Auer
(74) *Attorney, Agent, or Firm* — Venable LLP; Michael A. Sartori; Tamatane J. Aga

(57) ABSTRACT

The present invention provides a diamond coated tool which is resistant to exfoliation at an interface between a base material and a diamond layer. The diamond coated tool of the present invention is a diamond coated tool including a base material and a diamond layer coating a surface of the base material, and characterized in that the surface of the base material has an arithmetic average roughness Ra of not less than 0.1 µm and not more than 10 µm and an average length of roughness profile elements RSm of not less than 1 µm and not more than 100 µm, and that the diamond layer has a plurality of cavities extending from a portion bordering on the base material in a crystal growth direction.

3 Claims, 2 Drawing Sheets

(51) Int. Cl.
*C23C 16/27* (2006.01)
*B23B 27/14* (2006.01)
*C23C 16/02* (2006.01)

(56) References Cited

U.S. PATENT DOCUMENTS

| | | | |
|---|---|---|---|
| 6,110,240 A | 8/2000 | Saguchi et al. | |
| 6,432,150 B1 * | 8/2002 | Levashov et al. | 51/307 |
| 2005/0181174 A1 * | 8/2005 | Weerasinghe et al. | 428/141 |
| 2007/0029190 A1 | 2/2007 | Hosonuma et al. | |

FOREIGN PATENT DOCUMENTS

| | | |
|---|---|---|
| JP | 01-201475 | 8/1989 |
| JP | 02-217398 | 8/1990 |
| JP | 04-263075 | 9/1992 |
| JP | 06-025853 | 2/1994 |
| JP | 08-311652 | 11/1996 |
| JP | 10-287491 | 10/1998 |
| JP | 10-310494 | 11/1998 |
| JP | 11-058106 | 3/1999 |
| JP | 2002-079406 | 3/2002 |

* cited by examiner

DIAMOND COATED TOOL

TECHNICAL FIELD

The present invention relates to a diamond coated tool, and particularly to a diamond coated tool in which a base material has a surface coated with a diamond layer.

BACKGROUND ART

A diamond coated tool having a structure in which a material such as cemented carbide serves as a base material and the base material has a surface coated with a polycrystalline diamond layer, has been developed since long ago.

A diamond coated tool in which a base material has a surface coated with a diamond layer has a rigid surface, and is therefore capable of processing difficult-to-cut materials, such as fiber reinforced plastics (FRP) and the like, which have been considered to be difficult to process with a tool.

In applying a diamond coated tool to the difficult-to-cut materials described above, one of the determinants of the tool's life is adhesion between a base material and a diamond layer. That is, a diamond coated tool has a problem of being prone to exfoliation randomly occurring in cutting at an interface between a base material and a diamond layer, which results in a degraded grade of a cut material processed with a cutting tool after exfoliation and an unstable cutting tool life.

It has been conventionally attempted to increase adhesion between a base material and a diamond layer. For example, Japanese Patent Laying-Open No. 04-263075 (hereinafter referred to as "Patent Document 1") proposes a diamond coated tool in which a base material having a surface on which fine asperities are formed is used and a diamond layer is formed on the base material.

As shown in Patent Document 1, by forming a diamond layer on a base material having a surface with asperities, an anchor effect occurs between the base material and the diamond layer. This anchor effect can increase adhesion between the base material and the diamond layer. Such a diamond coated tool is resistant to exfoliation in the early stage of cutting between the base material and the diamond layer.

The diamond coated tool of Patent Document 1, however, experiences high frequency of exfoliation at an interface between the base material and the diamond layer when cutting is continued for a long time, and the problem of exfoliation between the base material and the diamond layer has not been fully solved. Further, Japanese Patent Laying-Open No. 2002-079406 (hereinafter referred to as "Patent Document 2") also discloses a technology to form asperities on a surface of a base material, as in Patent Document 1. The technology, however, does not show any remarkable improvement in prolongation of the life of a diamond coated tool.

Meanwhile, exfoliation between a base material and a diamond layer is believed to be caused by a difference between a coefficient of thermal expansion of the base material and a coefficient of thermal expansion of the diamond layer. That is, it is presumed that when a diamond coated tool reaches high temperatures due to heat in cutting, compressive or tensile residual stress is exerted on a diamond layer in the vicinity of an interface with the base material, thereby causing exfoliation to occur between the base material and the diamond layer.

For this reason, Japanese Patent Laying-Open No. 11-058106 (hereinafter referred to as "Patent Document 3") takes an approach of relaxing residual stress occurring in a diamond layer when a diamond coated tool reaches high temperatures to achieve increased adhesion between a base material and the diamond layer. Specifically, adhesion between a base material and a diamond layer is increased by controlling the coefficient of thermal expansion and a material of a base material, the thickness of a diamond layer, and the like.

PRIOR ART DOCUMENTS

Patent Documents

Patent Document 1: Japanese Patent Laying-Open No. 04-263075
Patent Document 2: Japanese Patent Laying-Open No. 2002-079406
Patent Document 3: Japanese Patent Laying-Open No. 11-058106

SUMMARY OF THE INVENTION

Problems to be Solved by the Invention

Adhesion between a base material and a diamond layer tends to be increased by the technology disclosed in Patent Document 3. The technique of Patent Document 3, however, extremely limits the material of a base material, the thickness of a diamond layer, and the like. This often leads to a design which ignores manufacturing cost, and the technology has hardly reached practical use.

In recent years, materials subjected to cutting are on a trend of increasingly becoming difficult to cut, and the progress of technology of processing cutting tool is rapid. Therefore, the quality required for a diamond coated tool is also increasingly becoming higher.

For the diamond coated tool, a number of technologies for enhancing adhesion between a base material and a diamond layer have been proposed as described above. However, the adhesion cannot be yet said to be sufficient, and further enhancement of adhesion is desired.

The present invention has been made in view of the circumstances as described above, and an object of the invention is to provide a diamond coated tool which is resistant to exfoliation at an interface between a base material and a diamond layer, not only in the early stage of cutting but also when cutting is continued for a long time.

Means for Solving the Problems

The diamond coated tool of the present invention is a diamond coated tool including a base material and a diamond layer coating a surface of the base material, and characterized in that the surface of the base material has an arithmetic average roughness Ra of not less than 0.1 µm and not more than 10 µm and an average length of roughness profile elements RSm of not less than 1 µm and not more than 100 µm, and that the diamond layer has a plurality of cavities extending from a portion bordering on the base material in a crystal growth direction.

Preferably, arithmetic average roughness Ra is not less than 0.4 µm and not more than 4 µm, and average length of roughness profile elements RSm is not less than 2 µm and not more than 20 µm.

Preferably, in a given section taken through the diamond coated tool at a plane including the base material and the diamond layer, the number of cavities relative to the length of the base material is not less than $1 \times 10^3$/cm and not more than $1 \times 10^6$/cm.

Preferably, the cavities have a width of not less than 5 nm and not more than 200 nm relative to the crystal growth direction and a length of not less than 10 nm and not more than 1 μm in the crystal growth direction. Preferably, the diamond layer is made of polycrystalline diamond. Preferably, the diamond layer is formed by chemical vapor deposition process.

The diamond coated tool of the present invention as above can be suitably used to cut difficult-to-cut materials.

Effects of the Invention

With a configuration as described above, the diamond coated tool of the present invention achieves increased resistance to exfoliation between a base material and a diamond layer and an improved tool life, even when cutting is performed continuously with the tool.

MODES FOR CARRYING OUT THE INVENTION

The present invention will be described below in more detail.

Diamond Coated Tool

Figure 1:
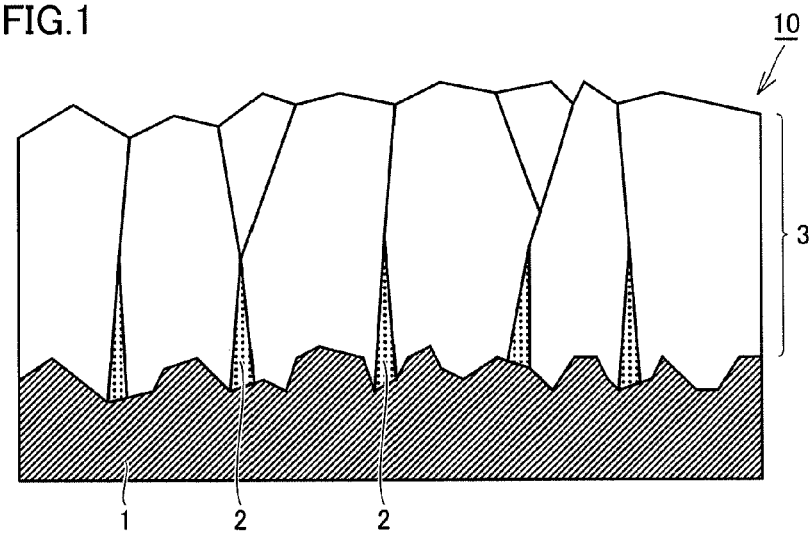
FIG. 1 is a schematic cross-sectional view of the diamond coated tool of the present invention in the vicinity of an interface between a base material and a diamond layer.

FIG. 1 is a schematic cross-sectional view of the diamond coated tool of the present invention in the vicinity of an interface between a base material and a diamond layer. A diamond coated tool 10 of the present invention includes a base material 1 and a diamond layer 3 formed on base material 1, as shown in FIG. 1. Diamond coated tool 10 of the present invention with such a configuration can be extremely useful as a drill, an end mill, a blade-edge-replaceable cutting tip for milling or lathe turning, a metal saw, a gear cutting tool, a reamer, a tap, or a tip for pin milling of a crankshaft, a cutting piece for cutting of glass-substrate, an optical fiber cutter, for example.

As seen from the above, the diamond coated tool of the present invention can be used for various applications, and in particular, it can be suitably used for processing difficult-to-cut materials which are considered to be difficult to process with conventional cutting tool. That is, the diamond coated tool of the present invention can be extremely effectively used for processing difficult-to-cut materials, since it has a surface to which enhanced hardness is imparted as compared with that of conventional cutting tools.

Base Material

As base material 1 of diamond coated tool 10 of the present invention, any conventionally known base material which is known as a base material for such cutting can be used without any particular limitation. Examples of such base materials can include: cemented carbide (for example, WC based cemented carbide, including those containing Co in addition to WC and possibly further having an additive of carbonitride or the like, such as Ti, Ta or Nb), cermet (those consisting primarily of TiC, TiN, TiCN or the like), high-speed steel, tool steel, ceramic (for example, titanium carbide, silicon carbide, silicon nitride, aluminum nitride, aluminum oxide, and a mixture thereof), cubic boron nitride sintered body, diamond sintered body, and the like.

When cemented carbide is used as a base material, even if the structure of such cemented carbide includes a free carbon and an abnormal phase called η-phase, the effects of the present invention are exhibited.

It is noted that base material 1 used in the present invention may as well have a modified surface. For example, in the case of cemented carbide, a β-free layer may be formed at a surface thereof, and in the case of cermet, a surface-hardened layer may be formed. Even with such a modified surface, the effects of the present invention are exhibited.

The present invention is characterized in that base material 1 having a surface shaped with asperities is used. Such an asperity shape has a mean value of amplitudes of asperities in the direction of height and a mean value of lateral amplitudes of asperities, which are each defined at a predetermined value. Specifically, a mean value of amplitudes of asperities in the direction of height is defined as an arithmetic average roughness Ra, which is required to be not less than 0.1 μm and not more than 10 μm. Further, a mean value of lateral amplitudes of asperities is defined as an average length of roughness profile elements RSm, which is required to be not less than 1 μm and not more than 100 μm.

Here, taking FIG. 2 described below for example, arithmetic average roughness Ra means a mean value of y-axial variations of a roughness profile ($y=Z(x)$) relative to a reference line ($y=0$). On the other hand, taking FIG. 3 described below for example, given that a point at which roughness profile $y=Z(x)$ changes from positive to negative is a reference point, average length of roughness profile elements RSm means an average of a length from one reference point to another adjacent reference point. It is noted that Ra and RSm will be described later in detail in conjunction with FIGS. 2 and 3.

Allowing Ra and RSm of a surface roughness of a base material to fall within a predetermined numerical range in this manner facilitates anchoring of an early development core of a diamond into the base material in the formation of a diamond layer described later, and therefore, increased adhesion between the base material and the diamond layer can be achieved.

Furthermore, by coating a base material having a specific asperity state as described above with a diamond layer by a chemical vapor deposition (CVD) process, a plurality of cavities 2 which extend from a portion bordering on base material 1 in a crystal growth direction can be formed in diamond layer 3, as shown in FIG. 1. These cavities 2 then exhibit a function of relaxing residual stress produced at diamond layer 3 due to a difference between coefficients of thermal expansion of base material 1 and diamond layer 3.

The relaxing effect exerted by cavities 2 on residual stress, combined with the above-described anchor effect, can remarkably enhance adhesion between base material 1 and diamond layer 3. Their synergistic effect provides the present invention with resistance to exfoliation at an interface between base material 1 and diamond layer 3 even if cutting is performed continuously. It is noted that details of cavities 2 will be described later.

Here, preferably, the above-described Ra is not less than 0.4 μm and not more than 4 μm, and RSm is not less than 2 μm and not more than 20 μm. More preferably, Ra is not less than 1.3 μm and not more than 2.6 μm, and RSm is not less than 3

μm and not more than 6 μm. By imparting such surface roughness to a base material, in addition to the above-described enhancing effect on adhesion between a base material and a diamond layer, a smooth surface of a tool after deposition of a diamond layer can be achieved. Moreover, adhesion of diamond layer to a base material can be increased, and therefore, improved processing grade of a material subjected to cutting and prolonged tool life can be both achieved.

Examples of methods for forming asperity state as described above include a chemical etching treatment, a sandblasting treatment, an electrochemical etching treatment, a combination of these treatments, and the like.

Here, each of the above-indicated etching processes will be illustrated by a specific example. An example of a chemical etching treatment includes immersing a base material in a mixed acid of sulfuric acid and acetic acid to dissolve a part of a surface of the base material. Preferably, a mixed acid used for a chemical etching treatment has a sulfuric acid concentration of not less than 10% by mass and not more than 98% by mass and an acetic acid concentration of not less than 10% by mass and not more than 70% by mass. Further, preferably, the time duration of immersion of a base material in a mixed acid is not less than 30 seconds and not more than 60 minutes.

An example of a sandblasting treatment includes blasting particles of alumina and silicon carbide. Preferably, particles used for a sandblasting treatment have a mean particle size (diameter of a particle) of not less than 5 μm and not more than 80 μm. Preferably, blast injection pressure of the particles against a base material is not less than 0.1 MPa and not more than 0.4 MPa. An example of an electrochemical etching treatment includes electrolyzing Co contained in components of a base material, in electrochemical manner.

Arithmetic Average Roughness

What is called arithmetic average roughness Ra in the present invention is a parameter indicating the length of asperities in the direction of height that are formed on a surface of a base material. The larger value of Ra indicates the rougher irregularity of asperities. A method of determining arithmetic average roughness Ra by calculation will be described below using FIG. 2. FIG. 2 shows a graphed exemplary cross-section of a base material used for the present invention. As shown in FIG. 2, a function of roughness profile of a base material in a reference length L is expressed by y=Z(x). Here, a reference line (a line shown by y=0) of a roughness profile (y=Z(x)) is defined such that with regard to the area of portions enclosed by the reference line and the roughness profile, the sum total area of portions located below the reference line and the sum total area of portions located above the reference line are equal. That is, in FIG. 2, the roughness profile located below the reference line is folded up above the reference line, and a dashed line shows an outline of the folded portion. The reference line (y=0) is defined such that the sum total area of a diagonally shaded portion enclosed by the dashed line and the sum total area of diagonally shaded portion enclosed by a solid line of the roughness profile are equal. Mathematically, the reference line is defined to satisfy Expression (1) below.

$$\int_0^L Z(x)dx = 0 \quad (1)$$

Arithmetic average roughness Ra in the present invention is determined with reference to the reference line defined in the above-described manner, by calculation integrating an absolute value of the roughness profile with respect to reference length L (i.e., integrating a function of y=|Z(x)| in the range of 0≤x≤L) and dividing the obtained value by L. That is, arithmetic average roughness Ra is determined by calculation of Expression (2) below.

$$Ra = \frac{1}{L}\int_0^L |Z(x)|\,dx \quad (2)$$

Figure 2:
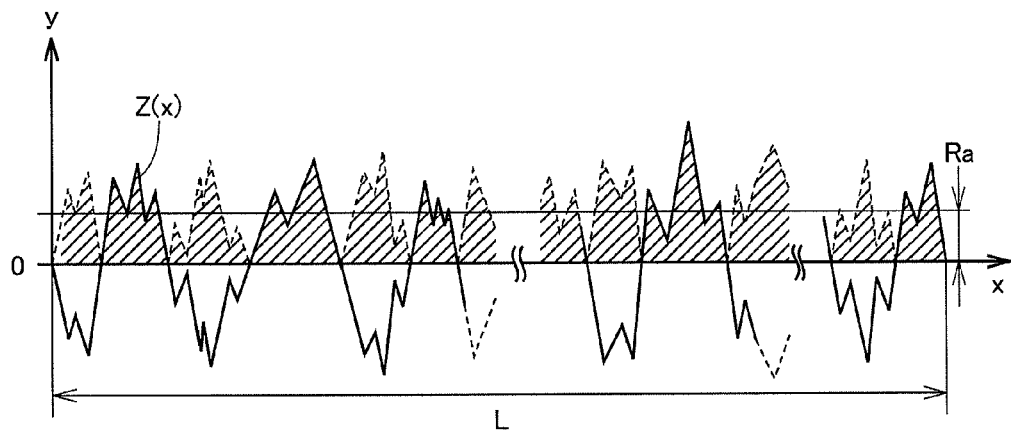
FIG. 2 shows a graphed cross-section of a base material used for the diamond coated tool of the present invention with an indication of arithmetic average roughness Ra.

To conceptually describe arithmetic average roughness Ra using FIG. 2, the height given by averaging the above-described sum of the area of diagonally shaded portions enclosed by the dashed line and the area of diagonally shaded portions enclosed by the solid line of the roughness profile, by reference length L, corresponds to arithmetic average roughness Ra.

Average Length of Roughness Profile Elements

Figure 3:
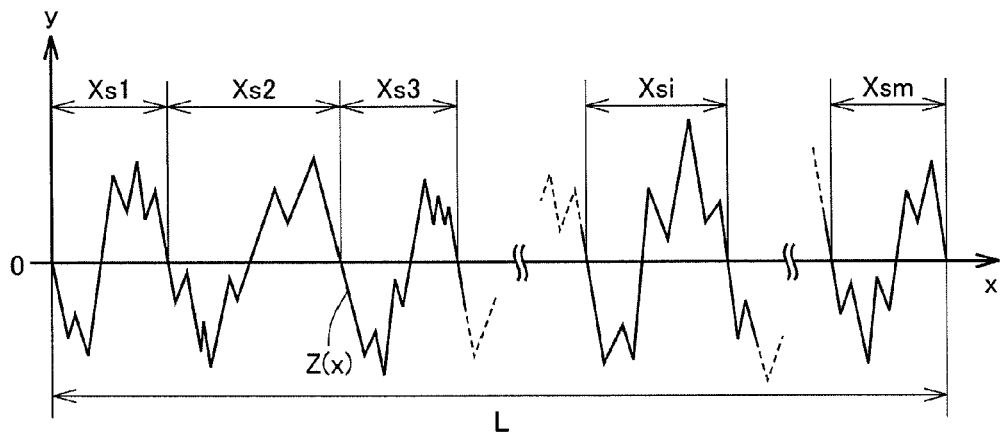
FIG. 3 shows a graphed cross-section of a base material used for the diamond coated tool of the present invention with an indication of the length of contour curve element Xs.

Average length of roughness profile elements RSm in the present invention is a parameter indicating a widthwise length of an asperity state formed on a surface of a base material (pitch). The larger value of RSm indicates the lower pitch of asperities. In the present invention, average length of roughness profile elements RSm employs a method specified in JIS B0601:2001. Based on FIG. 3, a method of determining average length of roughness profile elements RSm by calculation is now described. FIG. 3 shows a graphed cross-section of a base material used for the present invention. In FIG. 3, when the length from a point at which the roughness profile (y=Z(x)) switches from positive to negative (hereinafter referred to "reference point") to another adjacent reference point is defined as a length of contour curve elements Xs, m lengths of contour curve elements (Xs1, Xs2, Xs3 ... Xsi .... Xsm in FIG. 3) can be obtained in the range of reference length L. The mean value of these m lengths of contour curve elements is average length of roughness profile elements RSm. That is, average length of roughness profile elements RSm is determined by calculation of Expression (3) below.

$$RSm = \frac{1}{m}\sum_{i=1}^{m} Xsi \quad (3)$$

It is noted that, as clearly seen from FIG. 3, the total sum of m lengths of contour curve elements Xs1, Xs2, Xs3 ... Xsi .... Xsm corresponds to reference length L. Therefore, average length of roughness profile elements RSm in Expression (3) can also be simply expressed as L/m.

Method of Measuring Surface Roughness

As to the above-described parameters of surface roughness (Ra and RSm), a surface of a base material may be measured prior to the formation of a diamond layer on the base material, or a surface of a base material may be directly or indirectly measured after the formation of a diamond layer. It is, however, preferable to measure the surface roughness of a base material prior to the formation of a diamond layer on the base material in view of the fact that the surface roughness of the base material can be measured without causing any damage to the diamond layer.

Here, as to a method of measuring the surface roughness of a base material, a device capable of parametric analysis in conformity with ISO standards or JIS standards can be utilized. For example, a contact stylus measuring device and an optical (laser, interference, or the like) measuring device are commercially available, and in particular, a laser microscope is suitable for measuring the surface roughness of the base material of the present invention, because of a high spatial resolution and easy numerical analysis. Ra and RSm in the present specification are values obtained by a measurement using a laser microscope having a laser wavelength of 408 nm, a horizontal spatial resolution of 120 nm, and a vertical resolution of 10 nm.

Further, as a method of measuring the surface roughness of a base material after formation of a diamond layer on the base material, in addition to a method by which a diamond layer is removed in any manner followed by a measurement in the manner as illustrated above, one may use a method by which a base material is cut together with a diamond layer, then, from a direction perpendicular to the section, asperities on a surface are observed, and the observed asperities are quantified.

Even when a measurement of the surface roughness (Ra and RSm) of the base material using measuring devices as illustrated above provides measurements that vary within the surface, if at least one point falls within the numerical range defined in the present invention, then the effects of the present invention are exhibited. Here, it is preferable that the surface roughness of a base material when reference L is set to be not less than 10 μm satisfies the above-indicated numerical range.

Diamond Layer

In the present invention, preferably, a diamond layer formed on a base material is a film made of polycrystalline diamond. Here, polycrystalline diamond refers to diamond microparticles of on the order of 10 nm to several μm which are firmly coupled together. More preferably, such a diamond layer is formed by a deposition process which increases crystallinity. Further, from the standpoint of forming a plurality of cavities extending from a base material in a crystal growth direction concurrently with the formation of a diamond layer, it is necessary to use a CVD process.

It is noted that in the present invention, the term "crystal growth direction" refers to a vector direction in which, given a particular point on a surface of a base material as a base point, the shortest distance from the base point to a surface of a diamond layer is obtained.

As a CVD process suitably used in forming a diamond layer, any conventionally known CVD processes can be used without any particular limitation. Examples of such CVD processes can include a microwave plasma CVD process, a hot-filament CVD process, a plasma jet CVD process, and the like. In particular, it is preferable to employ a heat filament CVD process.

Further, although it is preferable that the diamond layer of the present invention is formed such that the whole surface of a base material is coated, the base material may have a portion not coated with the diamond layer, and the diamond layer may have different composition at any portion above the base material. Further, in the present specification, only the case in which a diamond layer is formed on a base material is described, however, a single or more than one layer which is different from the diamond layer may be formed between the base material and the diamond layer.

It is noted that the above-described diamond layer may include a foreign atom, such as boron, nitrogen, silicon, for example, and may include an incidental impurity other than these elements.

Cavities in Diamond Layer

The diamond coated tool of the present invention is characterized in that when a diamond layer is formed on a base material, a plurality of cavities extending from the base material in a crystal growth direction are formed in the diamond layer. Since the diamond layer has a plurality of cavities, these cavities relax residual stress produced in the diamond layer due to a difference between coefficients of thermal expansion of the base material and the diamond layer. This can effectively prevent exfoliation between the base material and the diamond layer.

The above-described cavities can be confirmed with a scanning electron microscope (SEM). When the cavities are observed with SEM, the diamond coated tool, including the diamond layer, is cut together with the base material, and a commercially-available device for preparing a cross-sectional sample is used for the section to prepare a sample for SEM observation. Then, the presence or absence of a cavity and the shape thereof can be ascertained by observing the sample in the vicinity of an interface between the base material and the diamond layer by means of a SEM in an enlarged view.

It is noted that the above-described presence or absence of a cavity and the shape thereof may be observed with a transmission electron microscope (TEM). When observing cavities with a TEM, a thin section including the base material and the diamond layer is created with a focused ion beam etching device, and the thin section is observed with a TEM.

In the present invention, preferably, in a given section taken through the diamond coated tool, the number of cavities relative to the length of the base material in the section is not less than $1\times10^3$/cm and not more than $1\times10^6$/cm. By providing cavities in the diamond layer at such a ratio, the relaxing effect by the cavities on the above-described elastic stress can be increased.

The term "length of a base material" here refers to the length of an interface between the base material and the diamond layer which appears at a section taken through the diamond coated tool.

Further, preferably, the cavities are sized to have a width of not less than 5 nm and not more than 200 nm relative to the crystal growth direction and a length of not less than 10 nm and not more than 1 μm in the crystal growth direction. If the above-described cavities have a width of less than 5 nm or a height of less than 10 nm, then the size of cavities are not sufficient to obtain sufficient relaxing effect on residual stress produced in the diamond layer. Further, if the cavities have a width of more than 200 nm or a length of more than 1 μm, the cavities are so large that the diamond layer is prone to a crack starting from the cavity. In the present invention, it is not necessary for all cavities to fall within the above-described numerical range of the size, and it is only necessary for cavities appearing in a section taken through a diamond layer together with the base material to include one or more cavities falling within the above-described numerical range.

Here, the term the "width relative to the crystal growth direction" refers to a length in a direction orthogonal to the crystal growth direction.

Furthermore, the size (width and length) of cavities in the diamond layer can be ascertained by observing a given section taken through the diamond coated tool with the aforementioned SEM or TEM.

According to the study by the inventors of the present invention, it has been found that the number and size of the cavities formed in the diamond layer are profoundly affected by the asperity state on a surface of the base material (i.e., numerical values of Ra and RSm). This is, however, not the only finding and it has also been found that gas pressure and gas composition in the formation of the diamond layer, as well as the surface temperature of the base material and the like also have effect. Therefore, the desired number of cavities in the desired size can be formed by regulating the asperity state on a surface of the base material and controlling various conditions in the formation of the diamond layer.

For example, when forming the diamond layer using a hot-filament CVD device, it is preferable that the gas pressure within the hot-filament CVD device be not less than $1.3 \times 10^2$ Pa and not more than $2.6 \times 10^4$ Pa. This allows for formation of the desired number of cavities in the desired size. Further, as to composition of gas to be introduced, for example, it is preferable to use a mixed gas or the like having a $CH_4$ gas concentration relative to $H_2$ gas of not less than 0.3% by volume and not more than 20% by volume. Further, preferably, the surface temperature of the base material in the formation of the diamond layer is not less than 600° C. and not more than 1100° C.

EXAMPLES

The present invention will be described below in more detail with examples to which the present invention is not limited.

It is noted that although the diamond layer is hereinafter formed by a hot-filament CVD process, the diamond layer may be formed by a conventionally known CVD process, for example, a microwave plasma CVD process, a plasma jet CVD process, and the like.

Examples 1-14 and Comparative Examples 1-9

In the fabrication of diamond coated tools of examples and comparative examples, a base material made of HS K10 cemented carbide (WC-5% Co) and having a tool shape of SNMN120412 was used as the base material of the diamond coated tools.

The surface of the above-described base material was then etched by immersing the surface of the base material in a mixed acid of 98% by mass sulfuric acid and 60% by mass acetic acid for 20 minutes. Then, a sandblasting treatment was performed by which media having a variety of particle sizes (particles having a mean particle size of between 5 μm and 50 μm) was blasted against the base material at a blast injection pressure of 0.3 MPa. The base materials after the sandblasting treatment and to be used for examples and comparative examples were measured with respect to parameters Ra and RSm of their surface roughness using an optical laser microscope (product name: LEXT OLS3500 (manufactured by Olympus Corporation)). The result is shown in Table 1 below.

Next, a treatment for seeding nanosized diamond powder on the surface of the base material was performed. The base material which had received seeding treatment as above was then set in a publicly known hot-filament CVD device. In examples and comparative examples (except for Example 14 and Comparative Example 5), then 1% $CH_4/H_2$ gas was introduced into the hot-filament CVD device, its inner pressure was set at $4.0 \times 10^3$ Pa, and by means of a temperature adjustment device including a cooling mechanism which was installed in the hot-filament CVD device, the temperature of the above-described surface of the base material was set at 900° C. and the temperature of the filament was set at 2050° C. A diamond layer was then formed on the base material by a 10-hour growth under the diamond growth conditions described above. In this way, the diamond coated tools of examples and comparative examples (except for Example 14 and Comparative Example 5) were fabricated. A Raman spectroscopic examination of the diamond layers of the diamond coated tools fabricated in this way reveled that their structures were all polycrystalline diamond.

Figure 4:
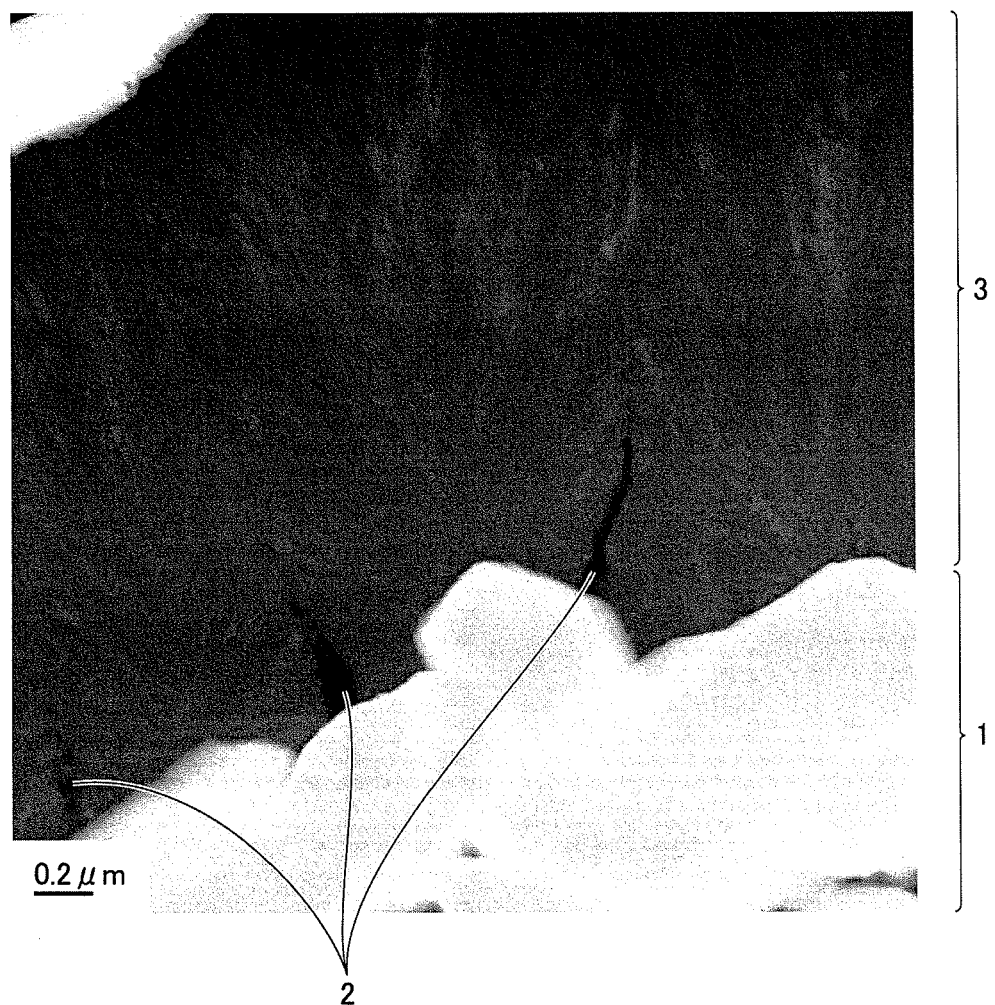
FIG. 4 is a photographed image taken in a transmission electron microscopic observation of a cross-section of the diamond coated tool of the present invention.

FIG. 4 is a photographed image taken in a transmission electron microscopic observation of a section taken at a given plane of the diamond coated tool fabricated in Example 1. As clearly seen from FIG. 4, it is understood that diamond layer 3 which has a plurality of cavities 2 extending from the base material in a crystal growth direction is formed by forming, under specified manufacturing conditions, diamond layer 3 on base material 1 having the parameters of the surface roughness (Ra and RSm) falling within a predetermined numerical value range.

Based on the photographed image of the section of FIG. 4, the number of cavities 2 relative to the length of base material 1 was determined by calculation. The result was that at a given plane of the section of the diamond coated tool, base material 1 had a length of 3 μm, and three cavities 2 were present for this length of base material 1. Accordingly, the number of cavities relative to the length of the base material was determined by calculation as 3/3 μm=$1.0 \times 10^4$/cm.

Further, the size of a specific cavity of the cavities presented in the photographed image of the section of FIG. 4 was determined by calculation. The cavity size was a width of 20 nm relative to the crystal growth direction and a length of 500 nm in the crystal growth direction.

As to the diamond coated tools of Examples 2-13 and Comparative Examples 1-4 and 6-9, the number and size of cavities were also determined by calculation in the same manner as Example 1 described above. The results are shown in Table 1 below.

TABLE 1

|  | Surface Roughness | | Cavity | | |
|---|---|---|---|---|---|
|  | Ra (μm) | RSm (μm) | Number of Cavity/ Length of Base Material (number/cm) | Size (nm) | |
|  |  |  |  | Width | Length |
| Example 1 | 2.5 | 5.2 | $1.0 \times 10^4$ | 20 | 500 |
| Example 2 | 0.42 | 2.1 | $1.1 \times 10^5$ | 10 | 100 |
| Example 3 | 3.8 | 19 | $5.5 \times 10^3$ | 100 | 720 |
| Example 4 | 0.11 | 1.1 | $1.0 \times 10^6$ | 5 | 10 |
| Example 5 | 9.8 | 99 | $1.0 \times 10^3$ | 200 | 1000 |
| Example 6 | 0.41 | 18 | $2.3 \times 10^5$ | 8 | 95 |
| Example 7 | 3.9 | 2.2 | $6.9 \times 10^3$ | 95 | 680 |
| Example 8 | 0.12 | 98 | $9.2 \times 10^5$ | 6 | 15 |
| Example 9 | 9.9 | 1.2 | $3.1 \times 10^3$ | 150 | 880 |
| Example 10 | 0.25 | 9.8 | $3.3 \times 10^5$ | 6 | 15 |
| Example 11 | 1.3 | 31 | $2.5 \times 10^4$ | 18 | 420 |
| Example 12 | 5.6 | 5.9 | $4.1 \times 10^3$ | 120 | 710 |
| Example 13 | 1.9 | 1.5 | $1.9 \times 10^4$ | 19 | 430 |
| Example 14 | 1.9 | 2.3 | $1.0 \times 10^6$ | 5 | 10 |

TABLE 1-continued

| | Surface Roughness | | Cavity | | |
| | Ra ($\mu m$) | RSm ($\mu m$) | Number of Cavity/ Length of Base Material (number/cm) | Size (nm) Width | Length |
|---|---|---|---|---|---|
| Comparative Example 1 | 0.09 | 0.9 | $2.0 \times 10^6$ | 4 | 9 |
| Comparative Example 2 | 11 | 103 | $9.5 \times 10^2$ | 250 | 1500 |
| Comparative Example 3 | 0.09 | 105 | $1.5 \times 10^5$ | 3 | 8 |
| Comparative Example 4 | 11 | 0.95 | $9.1 \times 10^2$ | 220 | 1200 |
| Comparative Example 5 | 2.4 | 5.1 | N/A | | |
| Comparative Example 6 | 1.8 | 108 | $9.8 \times 10^3$ | 6 | 9 |
| Comparative Example 7 | 3.1 | 0.96 | $9.1 \times 10^3$ | 4 | 20 |
| Comparative Example 8 | 0.08 | 4.9 | $2.6 \times 10^5$ | 4 | 8 |
| Comparative Example 9 | 10.5 | 7.5 | $1.1 \times 10^3$ | 6 | 8 |

It is noted that in Examples 1-13 and Comparative Examples 1-4 and 6-9, the base materials with different surface roughness from each other were used, and consequently, even though the diamond layers were fabricated in the same manner, the number and size of the cavities formed in the diamond layers were different from each other.

Meanwhile, in Example 14 and in Comparative Example 5, the diamond layers were deposited under conditions different from those of the above-described examples. Specifically, in Example 14, gas pressure and gas composition were altered from manufacturing conditions of the above-described examples to regulate the size and number of cavities formed in the diamond layer as shown in Table 1. In Comparative Example 5, the diamond layer was formed while regulating gas pressure and gas composition so as not to form cavities in the diamond layer.

The diamond coated tool of each example fabricated in this way is a diamond coated tool including a base material and a diamond layer coating a surface of the base material, the surface of the base material having arithmetic average roughness Ra of not less than 0.1 $\mu m$ and not more than 10 $\mu m$ and average length of roughness profile elements RSm of not less than 1 $\mu m$ and not more than 100 $\mu m$, and the diamond layer having a plurality of cavities extending from the base material in a crystal growth direction.

Evaluation of Adhesion of Diamond Coated Tool

The diamond coated tools of Examples 1-14 and Comparative Examples 1-9 fabricated in the above were respectively evaluated as to adhesion by being subjected to wet intermittent cutting. Cutting conditions were as shown in Table 2 below. A round bar of an Al-16% Si raw material which was provided with six grooves was used as the material subjected to cutting. Cutting was performed under conditions of a cutting rate of 400 m/min, a cutting depth of 0.5 nm, and a feed rate of 0.12 mm/rev. To evaluate adhesion under these cutting conditions, cutting was stopped at regular time intervals to observe the state of a blade edge, and the duration of time before the diamond layer exfoliates was employed as an evaluation index.

TABLE 2

| | Cutting Conditions |
|---|---|
| Material subjected to cutting | Round bar of Al-16% Si having six axial grooves |
| Cutting Rate (m/min) | 400 |
| Feed Rate (mm/rev) | 0.12 |
| Cutting Depth (mm) | 0.5 |

As a result of the above-described evaluation of adhesion, the time duration before the diamond layers of examples and comparative examples exfoliate was obtained, which are shown in Table 3 below. The longer time duration before exfoliation indicates the superior adhesion between the base material and the diamond layer.

TABLE 3

| | Time Before Exfoliation of Diamond Layer (min) |
|---|---|
| Example 1 | 100 |
| Example 2 | 85 |
| Example 3 | 71 |
| Example 4 | 69 |
| Example 5 | 61 |
| Example 6 | 77 |
| Example 7 | 73 |
| Example 8 | 68 |
| Example 9 | 63 |
| Example 10 | 70 |
| Example 11 | 72 |
| Example 12 | 71 |
| Example 13 | 69 |
| Example 14 | 95 |
| Comparative Example 1 | 11 |
| Comparative Example 2 | 9 |
| Comparative Example 3 | 12 |
| Comparative Example 4 | 6 |
| Comparative Example 5 | 2 |
| Comparative Example 6 | 16 |
| Comparative Example 7 | 13 |
| Comparative Example 8 | 14 |
| Comparative Example 9 | 15 |

As clearly seen from Table 3, it is apparent that the diamond coated tools of Examples 1-14 according to the present invention have enhanced adhesion as compared with the diamond coated tools of Comparative Examples 1-9. It has been confirmed that the life of the diamond coated tools has been improved.

Although embodiments and examples of the present invention have been described as above, it is also contemplated from the beginning to suitably combine configurations of the above-described embodiments and examples.

It should be construed that the embodiments and examples disclosed herein are by way of illustration in all respects, not by way of limitation. It is intended that the scope of the present invention is defined by claims, not by the above description, and includes all modifications equivalent in meaning and scope to the claims.

DESCRIPTION OF THE REFERENCE SIGNS

1 base material, 2 cavity, 3 diamond layer, 10 diamond coated tool.

The invention claimed is:

1. A diamond coated tool comprising:

a base material; and a diamond layer coating a surface of said base material, the surface of said base material having an arithmetic average roughness Ra of not less than 0.1 μm and not more than 10 μm and an average length of roughness profile elements RSm of not less than 1 μm and not more than 100 μm, said diamond layer having a plurality of cavities extending from a portion bordering on said base material in a crystal growth direction, wherein in a given section taken through said diamond coated tool at a plane including said base material and said diamond layer, the number of said cavities relative to a length of said base material is not less than $1 \times 10^3$/cm and not more than $1 \times 10^6$/cm, and wherein said cavities have a width of not less than 5 nm and not more than 200 nm relative to the crystal growth direction and a length of not less than 10 nm and not more than 1 μm in the crystal growth direction.

2. The diamond coated tool according to claim 1, wherein said diamond layer is made of polycrystalline diamond.

3. The diamond coated tool according to claim 1, wherein said diamond layer is formed by chemical vapor deposition process.

* * * * *